United States Patent [19]

Felcman et al.

[11] Patent Number: 5,403,208
[45] Date of Patent: Apr. 4, 1995

[54] EXTENDED CARD EDGE CONNECTOR AND SOCKET

[75] Inventors: Francis A. Felcman, Rosenberg, Tex.; Guy M. Gladden, Santa Clara, Calif.; Robert J. Johnson, Cupertino, Calif.; Geoffrey G. Moyer, Portola Valley, Calif.; James P. Paschal, Spring, Tex.; Heinz Piorunneck, Trumbull, Conn.; Douglas M. Thom, Woodside, Calif.

[73] Assignees: Burndy Corporation, Norwalk, Conn.; Compaq Computer Corporation, Houston, Tex.; Hewlett-Packard Company, Palo Alto, Calif.

[21] Appl. No.: 522,362

[22] Filed: May 11, 1990

Related U.S. Application Data

[63] Continuation of Ser. No. 300,095, Jan. 19, 1989, abandoned.

[51] Int. Cl.⁶ ............................................. H05K 1/00
[52] U.S. Cl. ................................... 439/633; 439/60
[58] Field of Search .......................... 439/166–177, 439/188, 217–224, 668, 669, 630–637, 59, 62, 65, 60, 61, 675

[56] References Cited

U.S. PATENT DOCUMENTS

| | | | |
|---|---|---|---|
| Re. 29,223 | 5/1977 | Pritulsky | 339/75 MP |
| 2,699,527 | 1/1955 | Kamowski | 324/19 |
| 2,983,896 | 5/1961 | Gilbert | 439/633 |
| 3,015,797 | 1/1962 | Mitchell et al. | 439/633 |
| 3,022,481 | 2/1962 | Stepoway | 339/75 |
| 3,130,351 | 4/1964 | Giel | 317/101 |
| 3,172,718 | 3/1965 | Lalonde | 339/176 |
| 3,173,737 | 3/1965 | Kinkaid et al. | 339/176 |
| 3,283,291 | 11/1966 | Krol et al. | 339/276 |
| 3,289,148 | 11/1966 | Antes . | |
| 3,399,372 | 8/1968 | Uberbacher | 339/17 |
| 3,417,362 | 12/1968 | Reynolds | 339/17 |
| 3,464,054 | 8/1969 | Mansfield . | |

(List continued on next page.)

FOREIGN PATENT DOCUMENTS

| | | |
|---|---|---|
| 419821 | 1/1970 | Australia . |
| 961560 | 1/1975 | Canada . |
| 0058578 | 8/1982 | European Pat. Off. . |
| 2431914 | 1/1975 | Germany . |
| 1048062 | 11/1966 | United Kingdom . |
| 2022329 | 12/1979 | United Kingdom . |
| 2028015 | 2/1980 | United Kingdom . |

OTHER PUBLICATIONS

IBM Technical Disclosure Bulletin, vol. 31, No. 1, Jun. 1988, pp. 191–192.
"Coaxial Cable to Pringted Circuit Board Connector", vol. 13, No. 6, Nov. 1970, one page, by Agard, Brearly and Jensen.
8181 New Electronics, vol. 17, No. 2, Jan. 1984, "Designing A Connector for Backplanes of the Future", M. J. Reynolds.
IBM Tech. Disclosure Bulletin, "Contractor Expansion of Electrical Connectors", vol. 30, No. 8, Jan. 1988, pp. 217–218.
High Density Plus One advertizement by Teradyne Connection Systems, Inc.
"The Connector Selector" Burndy Corporation Master Catalog, vol. 2, Chapters 10 and 11, 1986.

*Primary Examiner*—David L. Pirlot
*Attorney, Agent, or Firm*—Perman & Green

[57] ABSTRACT

A card edge connector for printed circuit boards is disclosed which employs a double-decker design. The connector may have the same length and width as conventional connectors used on Industry Standard Architecture (ISA) personal computers but is deeper. Conventional 8- and 16-bit ISA accessory circuit boards may be plugged into a corresponding socket which is also disclosed herein until they reach a stop upon which they rest, working as they would in an ISA personal computer. 32-bit Extended Industry Standard Architecture accessory circuit boards have a second row of connectors and a notch so they slide farther down into the socket, lining up with a second row of contacts. This design uses less physical space for connectors, allowing more room for logic circuitry on the motherboard.

30 Claims, 2 Drawing Sheets

U.S. PATENT DOCUMENTS

| | | | |
|---|---|---|---|
| 3,504,330 | 3/1970 | Holzhaeuser | 339/176 |
| 3,518,610 | 6/1970 | Goodman et al. | 339/17 |
| 3,526,869 | 9/1970 | Conrad et al. | 339/75 |
| 3,530,422 | 9/1970 | Goodman | 339/17 |
| 3,553,630 | 1/1971 | Scheingold et al. | 339/74 |
| 3,614,714 | 10/1971 | Silverstein | 339/186 M |
| 3,665,375 | 5/1972 | Thoms et al. | 339/192 R |
| 3,673,548 | 6/1972 | Mattingly, Jr. et al. | 339/186 M |
| 3,675,186 | 7/1972 | Jayne et al. | 439/633 |
| 3,683,317 | 8/1972 | Walkup | 339/75 MP |
| 3,737,838 | 6/1973 | Mattingly, Jr. et al. | 339/186 M |
| 3,742,430 | 6/1973 | Cairns et al. | 339/252 R |
| 3,797,108 | 3/1974 | Healy et al. | 29/630 C |
| 3,818,280 | 6/1974 | Smith et al. | 317/101 DH |
| 3,866,999 | 2/1975 | Doherty, Jr. | 339/17 CF |
| 3,868,166 | 2/1975 | Ammon | 339/176 MP |
| 3,899,234 | 8/1975 | Yeager et al. | 339/74 R |
| 3,975,076 | 8/1976 | Shida et al. | 339/17 L |
| 3,989,344 | 11/1976 | Pechard et al. | 339/176 MP |
| 4,045,114 | 8/1977 | Dechelette | 339/210 M |
| 4,045,868 | 9/1977 | Ammon et al. | 29/629 |
| 4,047,782 | 9/1977 | Yeager | 339/75 MP |
| 4,077,694 | 3/1978 | Cobaugh et al. | 339/176 MP |
| 4,095,866 | 6/1978 | Merrill | 339/17 E |
| 4,106,841 | 8/1978 | Vladic | 339/176 M |
| 4,133,592 | 1/1979 | Cobaugh et al. | 339/17 M |
| 4,159,861 | 7/1979 | Anhalt | 339/75 MP |
| 4,165,909 | 8/1979 | Yeager et al. | 339/75 MP |
| 4,166,667 | 9/1979 | Griffin | 339/176 MP |
| 4,179,177 | 12/1979 | Lapraik | 339/74 R |
| 4,184,735 | 1/1980 | Ammon et al. | 339/217 S |
| 4,226,496 | 10/1980 | Lungham | 339/176 MP |
| 4,239,323 | 12/1980 | Tamburro | 339/186 M |
| 4,298,237 | 11/1981 | Griffith et al. | 339/17 L |
| 4,303,294 | 12/1981 | Hamsher, Jr. et al. | 339/74 R |
| 4,343,523 | 8/1982 | Cairns et al. | 339/59 M |
| 4,403,819 | 9/1983 | Weber | 339/75 MP |
| 4,431,252 | 2/1984 | Cairns et al. | 339/176 MP |
| 4,487,468 | 12/1984 | Fedder et al. | 339/75 MP |
| 4,546,414 | 10/1985 | Donges | 361/413 |
| 4,546,542 | 10/1985 | Proud | 29/874 |
| 4,561,712 | 12/1985 | Borne et al. | 339/33 |
| 4,636,021 | 1/1987 | Bobb et al. | 339/75 MP |
| 4,645,279 | 2/1987 | Grabbe et al. | 339/17 CF |
| 4,655,518 | 4/1987 | Johnson et al. | 339/17 LC |
| 4,684,194 | 8/1987 | Jenkins et al. | 439/260 |
| 4,705,338 | 11/1987 | Sitzler | 439/260 |
| 4,720,156 | 1/1988 | Beers | 439/260 |
| 4,759,729 | 7/1988 | Kemppainen | 439/188 |
| 4,804,336 | 2/1989 | Miller et al. | 439/170 |
| 4,806,103 | 2/1989 | Kniese et al. | 439/60 |
| 4,842,532 | 6/1989 | Krause | 439/174 |
| 4,846,734 | 7/1989 | Lytle | 439/637 |
| 4,869,672 | 9/1989 | Andrews, Jr. | 439/60 |

EXTENDED CARD EDGE CONNECTOR AND SOCKET

This is a continuation of application Ser. No. 07/300,095, filed on Jan. 19, 1989, abandoned. This continuation application also claims the priority benefit of application Ser. No. 07/287,765, filed on Dec. 21, 1988. Both of these earlier applications are specifically incorporated by reference for this application.

BACKGROUND OF THE INVENTION

1. Field of the Invention

This invention relates to electrical connectors for printed circuit boards (i.e., printed wiring boards). More particularly, it relates to card edge connectors and the corresponding female sockets for such connectors, such as sockets used within a personal computer used to electrically connect adapter, peripheral and expansion cards to the personal computer expansion slots.

2. Description of the Prior Art

Printed circuit boards ("PCB's") are often provided with card edge connectors for the purpose of making electrical connection to the PCB. The card edge connector consists of a projection along an edge of the PCB which is provided with an array of generally planar, exposed metal pads on either side of the projection. Although other spacings are possible and have been used, these contact pads are typically spaced apart 0.100 inch on center to make the alignment between PCB edge and mating connector less critical and are often gold-plated to make them corrosion resistant and to provide an electrical connection with negligible contact resistance. A card edge connector is, therefor a male electrical connector.

The female socket for a card edge connector typically comprises a slotted, molded plastic box with an elongated opening along its upper surface for receiving the projection on the PCB. The interior of the slot is lined with an array of inwardly-biased, spring-loaded contacts which are spaced to correspond to the exposed metal pads on the card edge connector. Typically, the spring-loaded contacts are the upper portion of solder pins which extend through the bottom of the socket in two parallel rows. These solder pins are designed for insertion into through-holes of a PCB "motherboard". The pins are subsequently pressed or soldered to the motherboard (most commonly in a wave soldering operation) to provide both electrical and mechanical connection to the PCB motherboard. The connector pins are also suitable for surface mounting techniques.

The first generation of personal computers such as the IBM PC and the Compaq Deskpro had 62-pin sockets on their motherboards for the card edge connectors of accessory circuit boards ("cards") such as disk controllers, modems, and the like. These devices typically operated with an 8-bit I/O bus.

The second generation of personal computer conforming to the industry standard architecture ("ISA") such as the Compaq Deskpro 286 computer, the IBM PC-AT computer, and the Hewlett Packard Vectra computer feature a 16-bit I/O bus and many accessory cards utilize the 16-bit bus. Accordingly, it was necessary to increase the number of contacts on card edge connectors and their corresponding sockets on the motherboard. This was accomplished by providing an additional 36-pin card edge connector in line with a conventional 62-pin card edge connector. Likewise, an additional 36-pin socket can be provided in line with the conventional 62-pin socket, or a single piece, 98-pin socket may be used for a 32-bit bus connection. Although straightforward, this solution is not practical because of the excessive use of board space. 16-bit accessory cards, compatible with the industry standard architecture, typically have a gap between the two portions of the card edge connector to bridge the abutting walls of the end-to-end sockets on the motherboard.

State-of-the-art personal computers now feature a 32-bit I/O bus. Accordingly, it is necessary to provide a means for increasing the number of contacts on card edge connectors. A straightforward solution to this problem would be to simply provide an additional card edge connector in line with the conventional connectors of ISA cards. However, the corresponding socket(s) take up valuable surface area on the motherboard. Another approach is to decrease the spacing between the pins thus providing a greater number of contacts in the same space. However, this approach fails to provide compatibility with existing 8- and 16-bit cards having conventional pin spacings.

The present invention solves this problem by providing both an increase in the number of available contacts in the same length card edge connector and compatibility with conventional 8- and 16-bit cards by providing contact spacing comparable with existing connectors.

SUMMARY OF THE INVENTION

The present invention comprises an edge connector and socket which accommodates an expansion from 8- or 16-bit bus to a 32-bit bus without sacrificing the contact spacing of existing 8- and 16-bit cards. The present invention thus permits a user to migrate to a computer with a data bus with a greater bandwidth without investment in 8- and 16-bit peripheral and expansion cards.

The present invention comprises a card edge connector having a first pin spacing and a socket which accepts both that card edge connector and a card edge connector having a second pin spacing different from the first pin spacing.

Cards having the second pin spacing on their card edge connector can be inserted into the socket of the present invention only a fraction of its full depth. Transverse walls within the cavity of the socket and/or barriers at opposite ends of the connector prevent cards not having corresponding keyways (e.g., 8- and 16-bit ISA cards) from being fully inserted. These cards, when inserted to the depth selected by the height of the transverse walls or barriers, contact only an upper set of contacts along the walls on either side of the socket's central cavity.

Cards having the first pin spacing are also provided with keyways (i.e. slots) in their card edge connectors which are sized and spaced to correspond to the transverse walls within the central cavity of the socket and the barriers at the socket's extreme ends. Thus, these cards may be inserted the full depth of the socket. The cards having the first pin spacing are provided with two parallel rows of metal pads which mate with corresponding contacts in the walls of the socket. The socket has its contacts arranged in parallel rows—an upper row and a lower row on opposing walls. Thus, it will be appreciated that the upper rows of contacts function to provide electrical connection to 8-, 16-, and 32-bit cards, while the lower rows are used only by 32-bit cards. The contacts may therefore be considered a super set of the contacts for 8-, 16-bit cards, the upper contacts spaced to ensure pin-for-pin compatibility with existing 8-, 16-bit cards and the lower contacts combined with the upper contacts provide a connector which will accommodate a 32-bit expansion card.

DETAILED DESCRIPTION

Figure 1:
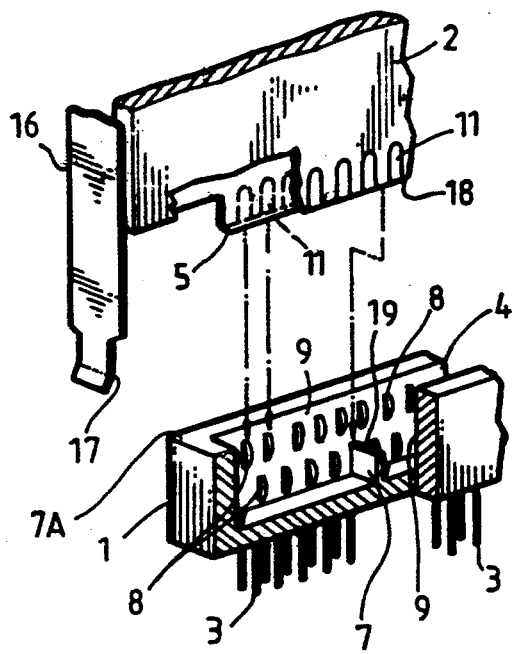
FIG. 1 is a partially cutaway perspective view of an ISA card connector having 0.100-inch contact spacing and the socket of the present invention.

Referring now to FIG. 1, an accessory circuit card 2 is illustrated. The accessory circuit card 2 comprises a backplane installation bracket 16 which has an alignment tongue 17 configured to assist in the alignment of the PCB and to mechanically secure the PCB to the computer chassis. Grounding connections may also be made through bracket 16. For illustration purposes, an 8- or 16-bit card is shown aligned for insertion into socket 1. The socket is a female connector which has spring loaded contacts 8 spaced to align with the exposed metal pads 11 on the accessory circuit card. In one preferred embodiment the contacts 8 and the exposed metal pads 11 are plated with a conductive material, preferably gold, to minimize the electrical contact resistance associated with a mechanical connector.

As further illustrated in FIG. 1, the contacts 8 extend downward and form solder pins 3 which are used to mechanically and electrically secure edge connector socket 1 to the printed circuit board by means of wave soldering or other soldering techniques.

The edge connector socket 1 comprises a molded plastic box 4 with an elongated rectangular opening along its upper surface. The slot along the upper surface accommodates the card edge connector. Edge connector 1 socket has contact pads 8 on opposite interior walls 9. Edge connector socket 1 further comprises transverse walls 7 which act as stops or barriers for 8- and 16-bit card edge connectors while providing mechanical strength to the socket. The transverse walls are also useful in the connector molding process assisting in the flow of the plastic.

As may be more fully appreciated from an inspection of FIG. 1, an upper level of contacts, commonly known as ISA card contacts, and lower level of contacts 8 are positioned in the interior 9 of edge connector 1. In the embodiment illustrated, the upper contacts are spaced 0.10 inch apart in order to maintain compatibility with the industry standard architecture and accessory cards which were built to conform to the industry standard architecture pin spacing. The lower level of contacts 8 are also spaced 0.10 inch apart and are offset from the upper row of contacts such that lines drawn perpendicular to the socket and passing through the center of each contact in each row of contacts are spaced 0.05 inch apart. The contact pads in the two rows are thus in a staggered configuration. This configuration can best be seen in FIG. 3 wherein the pads which comprise lower row 20 are offset 0.05 inch from the contact pads comprising upper row 22.

Figure 4A:
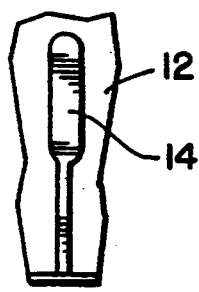
FIG. 4 is a side plan view of a PCB having an edge connector of the present invention.
Figure 4B:
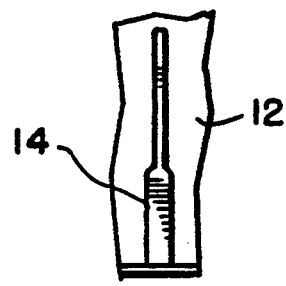
Figure 4:
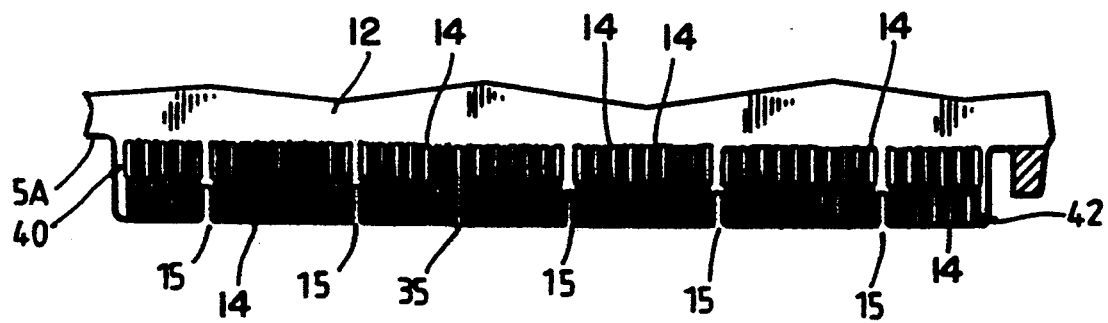

Referring again to FIG. 1, it will be seen that socket 1 is provided with card stop partition 7 which limits the travel of ISA card 2 as it is inserted into socket 1. The narrow edge of the connector 7A also operates as a stop or barrier. Referring to FIG. 1, a slot 5 in ISA cards also serves to limit the insertion depth into connector 1. In a similar fashion, lip 5A (referring to FIG. 4) serves to limit the insertion depth into connector 1. Although an EISA expansion card is illustrated in FIG. 4, a lip corresponding to present lip 5A also is present in ISA boards and serves to limit the insertion depth of ISA boards. When card 2 is fully inserted into socket 1, the upper surface 19 of partition 7 serves as a barrier to further insertion by abutting against lower edge 18 of the PCB of card 2. In a similar fashion barrier 7A serves as a stop when it abuts against the upper surface of slot 5. Preferably, socket 1 is provided with a plurality of card stop partitions or barriers so as to fully support card 2 when inserted and to prevent any rocking motion of the card and to further prevent inadvertent contact by an 8- and 16-bit card with the lower row of contacts. The height of partition 7 within the cavity of socket 1 is selected such that when fully inserted into the socket, none of the conductive pads 11 touch the contacts of the lower row of contacts 8 thus emulating a standard ISA socket. In this way, the socket of the present invention accommodates ISA accessory cards.

The socket of the present invention is preferably deeper than conventional edge connector sockets. It has been found that a card edge connector socket manufactured in accordance with these teachings can have substantially the same outside dimensions as a conventional socket. The improved socket is simply provided with a deeper cavity to accommodate the second row of contacts. In one preferred embodiment, the cavity has a depth of 0.5 inch. A conventional socket for ISA edge connectors is typically 0.3 inch deep. It has been found that the additional 0.2 inch of depth can be readily achieved by enlarging the cavity while leaving the outside dimensions of the socket unchanged from those of conventional ISA sockets. Card stop partitions 7 additionally function to reinforce the walls of the socket and thereby contribute to the structural strength of the socket by resisting flexing of the socket walls.

In one preferred embodiment, the distance from the upper surface of socket 1 to upper surface 19 of partition 7 is 0.3 inch, thereby providing the same insertion distance for ISA cards as conventional ISA card edge connector sockets.

Figure 2:
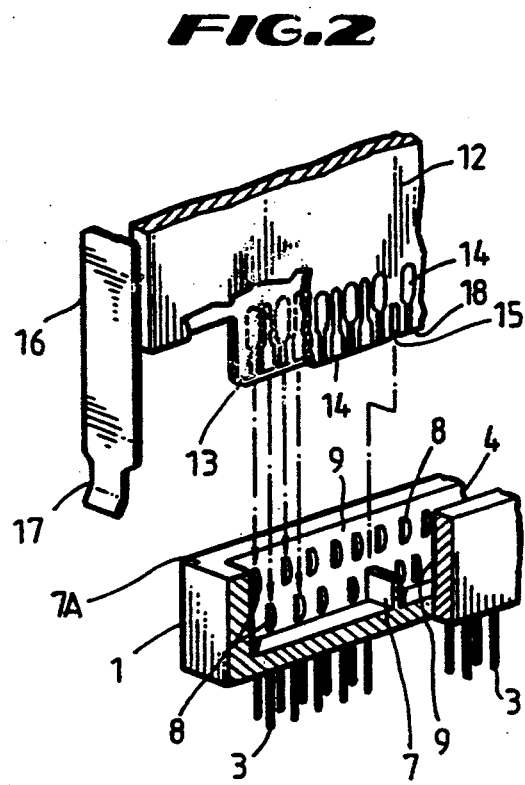
FIG. 2 is a partially cutaway perspective view of a card connector conforming to the Extended Industry Standard Architecture (EISA) which has 0.050-inch contact spacing and the socket of the present invention.

FIG. 2 illustrates an EISA accessory card 12 aligned for insertion into socket 1. It will be noted that card edge connector 13 projects further from the PCB comprising the card than that of ISA card 2 illustrated in FIG. 1. In one preferred embodiment, the card edge connector of EISA card 12 projects 0.500 inch from the card. In contrast, the edge connector of a conventional ISA card projects 0.300 inch.

As may be seen in FIG. 2, EISA card 12 is provided with grooves 15 along the lower edge of its card connector. Grooves 15 are sized and spaced to align with partition walls 7 in socket 1. In this way, EISA card 12 may be inserted fully into socket 1—i.e., inserted until the bottom edge of edge connector 13 contacts the bottom of the cavity. In this configuration an EISA card can fully utilize all of the contacts of the connector (e.g., the lower as well as the upper contacts). In contradistinction, accessory circuit cards conforming to ISA are not equipped with grooves 15 and are thereby prevented from being inserted to the same extent as an EISA card by card stop(s) 7.

As will be appreciated by those skilled in this art, a socket constructed in accordance with these teachings will have substantially the same insertion force as a conventional ISA card edge connector socket. This obtains because the card edge connector of the EISA card touches and spreads the inwardly-biased contacts of the upper and lower rows sequentially. In contrast, were one to provide more contacts in the same length socket merely by decreasing the spacing between contacts, a higher insertion force would be encountered inasmuch as one would be required to deflect a greater number of contacts simultaneously upon insertion.

It should also be appreciated that merely decreasing the spacing between contacts to provide more electrical connections per unit length of card edge connector does not allow one to utilize the same socket for card edge connectors having greater pad spacing since it is likely that the intermediate contacts would electrically bridge the pads 11 of conductive material and thus produce a short circuit between adjacent pads.

Figure 3:
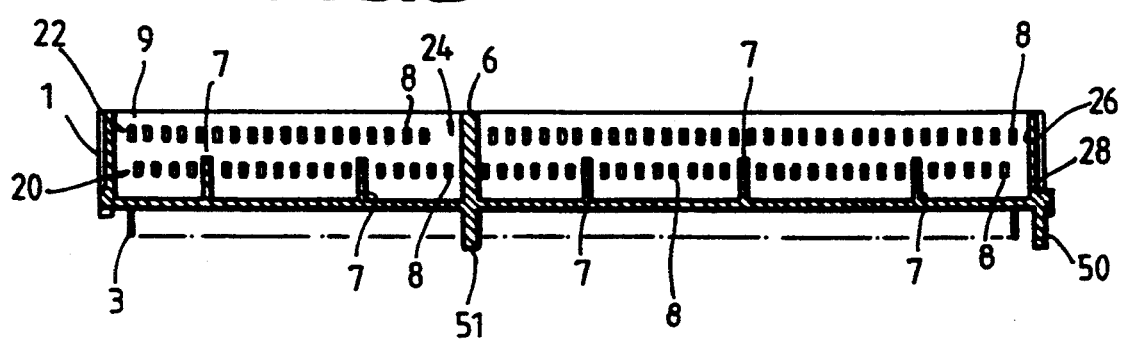
FIG. 3 is a cross-sectional view of the socket of the present invention.
Figure 3A:
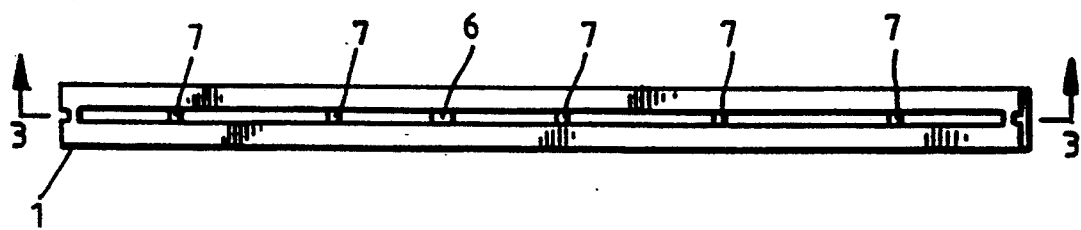
FIG. 3a is a top plan view of the socket of the present invention.

Referring now to FIG. 3, socket 1 is shown in cross section. FIG. 3a is a top plan view of socket 1 which shows the cavity which receives the card edge connector of the accessory circuit board. Also shown in FIG. 3a are card stops 7 and partition 6. In the embodiment illustrated, partition 6 extends the full depth of the cavity. Partition or wall 6 provides correspondence to the socket dimensions of 8-bit ISA edge card connectors. The distance between wall 6 and inner surface 26 of end wall 28 is selected to be equal to the length of a standard 8-bit ISA card edge connector. In this way, an 8-bit (62-pin) ISA and a 16-bit ISA accessory card may be correctly aligned when inserted into the socket of the present invention. Wall 6 also thus functions to ensure that accessory cards are inserted in socket 1 with the correct alignment. A keyway is provided in the card edge connectors of both 16-bit ISA cards and 32-bit EISA cards to accommodate wall 6. Therefore, socket 1 does not have end-to-end symmetry and the correct alignment of the board for insertion is unambiguous. Referring to FIG. 3, non-conductive pins 50 and 51 on the bottom edge of connector 1 serve to align the connector on the PCB and at the time the connector is inserted into the PCB, pins 50 and 51 thus ensure proper alignment prior to the connector soldering phase.

It will be noted that there is no electrical contact 8 at position 24 of the socket illustrated in FIG. 3. This is because ISA cards having a 16-bit bus (98-pin edge connector) have a corresponding gap between the 8-bit bus portion (62-pin connector) and the 16-bit bus 36-pin extension. Thus, a contact is not needed at position 24 to accommodate 16-bit ISA boards.

FIG. 4 is a plan view of an accessory circuit board conforming to the Extended Industry Standard Architecture. The board illustrated comprises an edge connector of the present invention. In the embodiment shown in FIG. 4, the pad spacing is 0.050 inch, twice the density of conventional ISA cards. It will be noted that the card illustrated provides 90 more electrical connections than a conventional ISA card in the same length card edge connector. Notches or keyways 15 and 35 are sized and spaced to allow the edge connector to be fully inserted into the socket of the present invention despite the presence of card stops 7 and partition 6.

It can be seen in the edge connector illustrated in FIG. 4 that conductive pads 14 of the top row 40 are longer than the conductive pads 14 of bottom row 42. In the illustrated connector the ratio of the two pad lengths is 3:5. The upper row of conductive pads can accommodate 3 amps of current in conformance with ISA specifications. For EISA connections, a 1-amp current is specified. It is therefore advantageous to provide smaller contacts on the bottom row (i.e., the EISA portion of the connector) so as to reduce the insertion force of the card edge connector.

The conductive pads of the lower row are provided with conductive extensions in order to make electrical connection to the printed wiring traces of the PCB. The conductive pads of the upper row are provided with conductive extensions which reach to the edge of the card connector. Although not necessary to the practice of the subject invention, these extensions serve at least two purposes: 1) they provide electrical connection to the edge of the PCB for convenience in electroplating; and 2) they provide a relatively clean and smooth surface for contacting electrical contacts 8 of socket 1 during insertion of the card edge connector into the socket.

Pins 3 and contacts 8 of socket 1 may be of conventional construction as is well known in the art. Most preferably, they are gold-plated to provide minimum contact resistance and freedom from oxidation. Likewise, conventional molding plastics may be used to fabricate socket 1.

The foregoing description has been directed to particular embodiments of the invention in accordance with the requirements of the United States patent statutes for the purposes of illustration and explanation. It will be apparent to those skilled in this art, however, that many modifications and changes in the apparatus and methods set forth will be possible without departing from the ,scope and spirit of the invention. It is intended that the following claims be interpreted to embrace all such modifications and changes.

We claim:

1. A dual purpose card-edge connector for use with either a first printed circuit card having conductive pads on one center-line spacing or a second printed circuit card having conductive pads on a different center-line spacing, said connector comprising:
  an elongated, dielectric housing having an elongated, outwardly open card edge-receiving slot and one or more positioning means in said slot, said positioning means adapted to position the first circuit card at a high level in said slot and to position the second circuit card at a low level in said slot; and
  conductive contact elements disposed in said housing and extending alongside said slot and having contact portions thereon projecting into said slot at alternatingly high and low levels, said contact portions at said high level adapted to engage conductive pads on either the first or second circuit card which may be inserted into said slot and said contact portions at said low level adapted to engage conductive pads on the second circuit card which may be inserted into said slot.

2. The connector of claim 1 further including polarizing means for cooperating with polarizating means on the first and second printed circuit cards.

3. The connector of claim 1 wherein the second printed circuit card has notches on one edge and said positioning means include transverse walls extending upwardly in said slot and which cooperate with the notches to permit the second printed circuit card to be positioned at the low level.

4. The connector of claim 3 wherein the outwardly facing surfaces of the transverse walls are between the upper and low levels so that the first printed circuit card abuts thereagainst upon being inserted into the slot.

5. A dual purpose card-edge connector for receiving either a first printed circuit card having parallel circuits on one center-line spacing or a second printed circuit card having parallel circuits on different center-line spacing, said connector comprising:
   an elongated, insulative housing having an elongated, outwardly open card-edge receiving slot in one surface thereof, and positioning means disposed in said slot for positioning, the first printed circuit card at an upper level in the slot and the second printed circuit card at a lower level in the slot;
   a plurality of first conductive contact elements disposed in the housing and having contact portions extending into the slot at the upper level for engaging the circuits on either the first or second printed circuit card which may be inserted thereinto; and a plurality of second conductive contact elements disposed in the housing and having contact portions extending into the slot at the lower level for engaging the circuits on the second printed circuit card which may be inserted therein, said contact portions of said second elements further being longitudinally offset in the slot relative to the contact portions on the first contact elements.

6. A dual purpose card edge connector configured and adapted to mate with both a first card having a plurality of first conductive pads arranged in a first spatial pattern and a second card having a plurality of second conductive pads arranged in a second spatial pattern, different from the first spatial pattern, said connector comprising:
   an elongated housing having a card edge receiving slot shaped to receive both the first card and the second card at respective times;
   a plurality of first contact elements disposed in the housing to extend alongside the slot and having first contact portions positioned to extend into the slot to contact respective ones of the first conductive pads above a selected level in the slot;
   a plurality of second contact elements disposed in the housing to extend alongside the slot and having second contact portions positioned to extend into the slot to contact respective ones of the second conductive pads below the selected level in the slot; and
   means in the housing for positioning the first card at an upper level in the housing, at which the first contact portions contact the first conductive pads and the second contact portions are isolated from the card and for positioning the second card at a lower level in the housing, at which the second contact portions contact the second conductive pads.

7. The connector of claim 6, wherein the first and second contact portions alternate with one another alongside the slot.

8. The connector of claim 6, wherein the second card has a plurality of third conductive pads arranged in the first spatial pattern, and wherein the first contact portions contact the third conductive pads when the second card is positioned in the slot at the lower level.

9. The connector of claim 8, wherein the first and second contact portions alternate with one another alongside the slot.

10. The connector of claim 6, wherein the positioning means comprises at least one positioning member extending at least partially across the slot.

11. The connector of claim 10, wherein the second card defines at least one recess, each positioned to receive a respective positioning member, and wherein the first card is configured to abut without receiving each positioning member.

12. A card edge connector assembly comprising;
   a printed circuit card having an edge and a plurality of first conductive pads arranged in a first spatial pattern at the edge;
   an elongated housing having a card receiving slot that receives the card with the first conductive pads at least partially in the slot, said housing comprising means for preventing the card from entering the slot beyond a selected level in the slot;
   a plurality of first contact elements disposed in the housing to extend alongside the slot and having first contact portions contacting respective ones of the first conductive pads above the selected level in the slot; and
   a plurality of second contact elements disposed in the housing to extend alongside the slot and having second contact portions positioned to extend into the slot below the selected level in the slot such that the second contact portions are isolated from all conductive pads on the card, said second contact portions configured to contact additional conductive pads of an additional card shaped to enter the slot beyond the selected level.

13. The connector assembly of claim 12 wherein the first and second contact portions alternate with one another alongside the slot.

14. The connector assembly of claim 12 wherein the preventing means comprises at least one positioning member extending at least partially across the slot and positioned to contact the printed circuit card to prevent the printed circuit card from entering the slot beyond the selected level in the slot.

15. A dual purpose first connector configured and adapted to mate with both a second connector having a plurality of first conductive elements arranged in a first spatial pattern and a third connector having a plurality of second conductive elements arranged in a second spatial pattern, different from the first spatial pattern, said first connector comprising;
   an elongated housing shaped to mate with both the second and third connectors at respective times:
   a plurality of first contact elements disposed in the housing and having first contact portions positioned to contact respective ones of the first conductive elements above a selected level in the housing;
   a plurality of second contact elements disposed in the housing and having second contact portions positioned to contact respective ones of the second conductive elements below the selected level in the housing; and means included in the housing for positioning the second connector at an upper level with respect to the housing, at which the first contact portions contact the first conductive elements and the second contact portions are isolated from the second connector, and for positioning the third connector at a lower level with respect to the housing, at which the second contact portions contact the second conductor elements.

16. The first connector of claim 15 wherein the first and second contact portions alternate with one another.

17. The first connector of claim 15, wherein the third connector has a plurality of third conductive elements arranged in the first spatial pattern, and wherein the first contact portions contact the third conductive elements when the third connector is positioned at the lower level with respect to the housing.

18. The first connector of claim 17, wherein the first and second contact portions alternate with one another.

19. The first connector of claim 15, wherein the positioning means comprises at least one positioning member.

20. The first connector of claim 19, wherein the third connector defines at least one recess, each positioned to receive a respective positioning member, and wherein the second connector is configured to abut without receiving each positioning member.

21. A card-edge connector adapted to receive a portion of a first type of circuit board card having conductive pads in a first array and also adapted to alternatively receive a portion of a second type of circuit board card having conductive pads in a second array different from the first array, the connector comprising:

a housing having a card-edge receiving area;

first contact members supported by the housing for electrically connecting to the pads on the first type of card upon insertion of the first type of card into the receiving area;

second contact members supported by the housing for electrically connecting to the pads on the second type of card upon insertion of the second type of card into the receiving area, the second contact members being located in a relatively deeper location in the receiving area than the first contact members; and stop means on the housing located between the first and second contact members adapted for locating the first type of card at a first predetermined position in the receiving area for electrically connecting the pads of the first type of card with the first contact members and, also adapted for locating the second type of card at a second predetermined position in the receiving area for electrically connecting the pads of the second type of card with the second contact members.

22. A connector as in claim 21 wherein the second type of card has at least one groove which cooperates with the stop means to enable the second type of card to be inserted into the receiving area beyond the first predetermined position.

23. A connector as in claim 21 wherein the stop means is comprised of a plurality of stop portions.

24. The connector as in claim 21 wherein the second contact members are longitudinally offset relative to the first contact members.

25. The connector as in claim 21 further including a partition for cooperating with a keyway on the first and second cards for aligning the cards in the connector.

26. A card-edge connector assembly having a connector adapted to receive a first type of circuit board card having conductive pads in a first array and, also adapted to receive a second type of circuit board card having conductive pads in a second array occupying similar positions on the second type of card as the first array has on the first type of card, and a third array, the connector comprising:

a housing having a card-edge receiving area;

first contact members supported by the housing for electrically connecting to the pads on the first type of card or the second array of conductor pads on the second type of card upon insertion of the first or second types of cards into the receiving area;

second contact members supported by the housing for electrically connecting to the pads on the second type of card upon insertion of the second type of card into the receiving area;

stop means on the housing at least partially located between the first and second contacts members for locating a leading edge of the first type of card at a predetermined position in the receiving area between the first and second contact members such that the pads of the first type of card are electrically connected to the first contact members, but do not electrically contact the second contact members; and a first type of card having a contact portion inserted into the receiving area having its conductive pads in electrical connection with the first contact members.

27. A card edge connector comprising:

a housing having a card edge receiving slot;

a plurality of contacts mounted to the housing, the contacts including upper contacts and lower contacts, the upper contacts having upper contact areas in the card edge receiving slot, the lower contacts having lower contact areas in the card edge receiving slot; and means for alternatively locating two different types of printed circuit cards in the card edge receiving slot at two different depths of insertion, the means for alternatively locating including housing card stops in the card edge receiving slot with upper surfaces located between the upper and lower contacts' contact areas such that a first type of card can be inserted and stopped at a first depth of insertion in the slot by the housing card stops with contact pads on the first card only contacting the upper contacts and, such that a second type of card can be inserted to a second depth of insertion in the slot with a leading edge of the second type of card having grooves to allow the leading edge of the second type of card to pass beyond the upper surfaces of the card stops to allow contact pads on the second card to contact the lower contacts.

28. The connector as in claim 27 wherein the lower contacts are longitudinally offset relative to the upper contacts.

29. The connector as in claim 27 further including a partition for cooperating with a keyway on the first and second cards for aligning the cards in the connector.

30. The connector as in claim 27 wherein the stop means is located between the upper and lower contacts.

* * * * *